US008514534B2

(12) United States Patent
Bandy, IV et al.

(10) Patent No.: US 8,514,534 B2
(45) Date of Patent: Aug. 20, 2013

(54) ELECTROSTATIC DISCHARGE (ESD) PROTECTION FOR ELECTRONIC DEVICES USING WIRE-BONDING

(75) Inventors: William T. Bandy, IV, Fremont, CA (US); Dylan J. Boday, Tucson, AZ (US); Peter J. Golcher, Los Gatos, CA (US); Icko E. T. Iben, Santa Clara, CA (US); Sassan K. Shahidi, San Jose, CA (US); Joyce L. S. Tang, Dublin, CA (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 12/839,528

(22) Filed: Jul. 20, 2010

(65) Prior Publication Data

US 2012/0019967 A1 Jan. 26, 2012

(51) Int. Cl.
*H02H 9/00* (2006.01)
*H02H 3/20* (2006.01)
*H02H 9/04* (2006.01)
*H02H 3/22* (2006.01)

(52) U.S. Cl.
USPC .............................. 361/56; 361/91.1; 361/111

(58) Field of Classification Search
USPC ........................... 361/56, 91.1, 111; 360/323
See application file for complete search history.

(56) References Cited

U.S. PATENT DOCUMENTS

| 6,339,793 | B1 | 1/2002 | Bostian et al. |
| 6,704,173 | B1 | 3/2004 | Lam et al. ..................... 360/323 |
| 6,972,933 | B1 * | 12/2005 | Wada et al. ................... 360/323 |
| 7,161,772 | B2 * | 1/2007 | Iben .............................. 360/323 |
| 7,548,405 | B2 | 6/2009 | Czarnecki et al. ............ 361/111 |
| 2004/0233573 | A1 * | 11/2004 | Kuwajima et al. ......... 360/97.01 |
| 2006/0018070 | A1 * | 1/2006 | Iben ............................ 361/91.1 |
| 2009/0154031 | A1 | 6/2009 | Bumanlag et al. ............ 360/323 |

FOREIGN PATENT DOCUMENTS

WO 2009/053912 4/2009

OTHER PUBLICATIONS

Shrier et al., "Embedding a Thin Polymer Voltage ESD Suppressing Core in A Chip Package—Alternative to On Chip ESD Protection," *Advancing Microelectronics*, pp. 28-32, 2007.

* cited by examiner

*Primary Examiner* — Rexford Barnie
*Assistant Examiner* — Christopher Clark
(74) *Attorney, Agent, or Firm* — Zilka-Kotab, PC

(57) ABSTRACT

A system in one embodiment includes a cable having a plurality of cable leads, and a multi-diode chip having a pad-side not facing the cable. The multi-diode chip includes a plurality of sets of contact pads on the pad-side of the multi-diode chip, and a plurality of crossed diode sets, wherein each set of crossed diodes is coupled between a first contact pad and a second contact pad of one set of contact pads, wherein at least two of the plurality of cable leads are coupled via wire-bonding to one of the plurality of sets of contact pads of the multi-diode chip for providing electrostatic discharge (ESD) protection for at least one element of the electronic device coupled to the at least two cable leads.

20 Claims, 6 Drawing Sheets

ELECTROSTATIC DISCHARGE (ESD) PROTECTION FOR ELECTRONIC DEVICES USING WIRE-BONDING

BACKGROUND

The present invention relates to data storage systems, and more particularly, this invention relates to insitue packaging for attaching diodes.

In magnetic storage systems, data is commonly read from and written onto magnetic recording media utilizing magnetic transducers. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has led to increasing the track density on recording tape, and decreasing the thickness of the magnetic tape medium. However, the development of small footprint, higher performance tape drive systems has created various problems in the design of a tape head assembly for use in such systems.

In a tape drive system, magnetic tape is moved over the surface of the tape head at high speed. This movement generally entrains a film of air between the head and tape. Usually the tape head is designed to minimize the spacing between the head and the tape. The spacing between the magnetic head and the magnetic tape is crucial so that the recording gaps of the transducers, which are the source of the magnetic recording flux, are in near contact with the tape to effect efficient signal transfer, and so that the read element is in near contact with the tape to provide effective coupling of the magnetic field from the tape to the read element.

Magnetoresistive (MR) sensors, such as giant magnetoresistive (GMR), anisotropic magnetoresistive (AMR) and tunnel valve magnetoresistive (TMR) sensors, are used to read data written on magnetic media. MR sensors are used extensively in the hard disk drive (HDD) and tape drive industries. MR sensors are highly sensitive to damage by electrostatic discharge (ESD) events. One means of protecting MR sensors from ESD damage is to use diode protection. It is important to note that the best location to attach the diodes for maximum protection is as close to the sensors as possible. In tape and HDDs, typically a flexible cable is attached to the MR sensors to allow a connection to external electrical devices. The cabled sensor modules (CMODs) are then assembled into a magnetic head which includes an actuator to move the sensor over the particular data track to be read. The actuation is high frequency, and the response of the actuation is slowed down by extra mass and cable rigidity, urging the use of smaller and smaller cables. In attaching the cables, the spacing between the cable leads can vary along the length of the cable. Furthermore, the spacing of the leads on the cable may change from one product to another. Diodes are typically purchased in a package and then attached in an electronic device. Several problems with the standard packaging is the significantly added mass and volume that these packaged diodes provide to the magnetic head.

In the case of modern tape drives, the space allotted to position electronics, such as diodes, near the sensors is very limited, and conventional pre-packaged electronics will not fit. Another solution that would allow for diode attachment would be to attach a chip directly to the cable through anisotropic conductive film (ACF) bonding. A limitation of both ACF and solder-type bonding used for standard surface mount packaging is that the spacing of the tabs on the chip or package and the cable must be matched precisely. For cables with spacing on the order of about 50 microns to about 200 microns, standard packages are not available. For the ACF type bonding; a problem exists of precision alignment to avoid shorting for dimensions of these sizes. Thus, the cable lead spacing must be adjusted to match the tab spacing on the chip or package. Therefore, a method of attaching diodes to the magnetic head and systems having the diodes attached in these smaller devices that avoid the problems encountered using conventional methods would be very beneficial.

BRIEF SUMMARY

A system according to one embodiment includes a cable having a plurality of cable leads, wherein at least two of the plurality of cable leads are coupled to at least one of a plurality of sets of element pads of an electronic device, wherein each set of element pads includes two element pads, wherein at least one set of element pads are coupled to an element of the electronic device; and a multi-diode chip having a pad-side not facing the cable. The multi-diode chip includes a plurality of sets of contact pads on the pad-side of the multi-diode chip, each set of contact pads including a first contact pad and a second contact pad; and a plurality of crossed diode sets, wherein each set of crossed diodes is coupled between a first contact pad and a second contact pad of one set of contact pads, wherein at least two of the plurality of cable leads are coupled via wire-bonding to one of the plurality of sets of contact pads of the multi-diode chip for providing electrostatic discharge (ESD) protection for at least one element of the electronic device coupled to the at least two cable leads.

A method according to one embodiment includes coupling, via wire-bonding, a set of cable leads of a cable to a set of contact pads on a pad-side of a multi-diode chip; and coupling, via wire-bonding, the sets of cable leads to elements of an electronic device, wherein the pad-side of the multi-diode chip does not face the cable, wherein the multi-diode chip has a thickness in a direction normal to a plane of the cable of about 100 microns or less, and wherein the set of contact pads are coupled there between by at least one crossed diode.

A system according to another embodiment includes a cable having a plurality of cable leads; and a multi-diode chip having a pad-side not facing the cable. The multi-diode chip includes a plurality of sets of contact pads on the pad-side of the multi-diode chip, each set of contact pads including a first contact pad and a second contact pad; and a plurality of crossed diode sets, wherein each set of crossed diodes is coupled between a first contact pad and a second contact pad of one set of contact pads. At least two of the plurality of cable leads are coupled via wire-bonding to one of the plurality of sets of contact pads of the multi-diode chip for providing electrostatic discharge (ESD) protection.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

DETAILED DESCRIPTION

Figure 1:
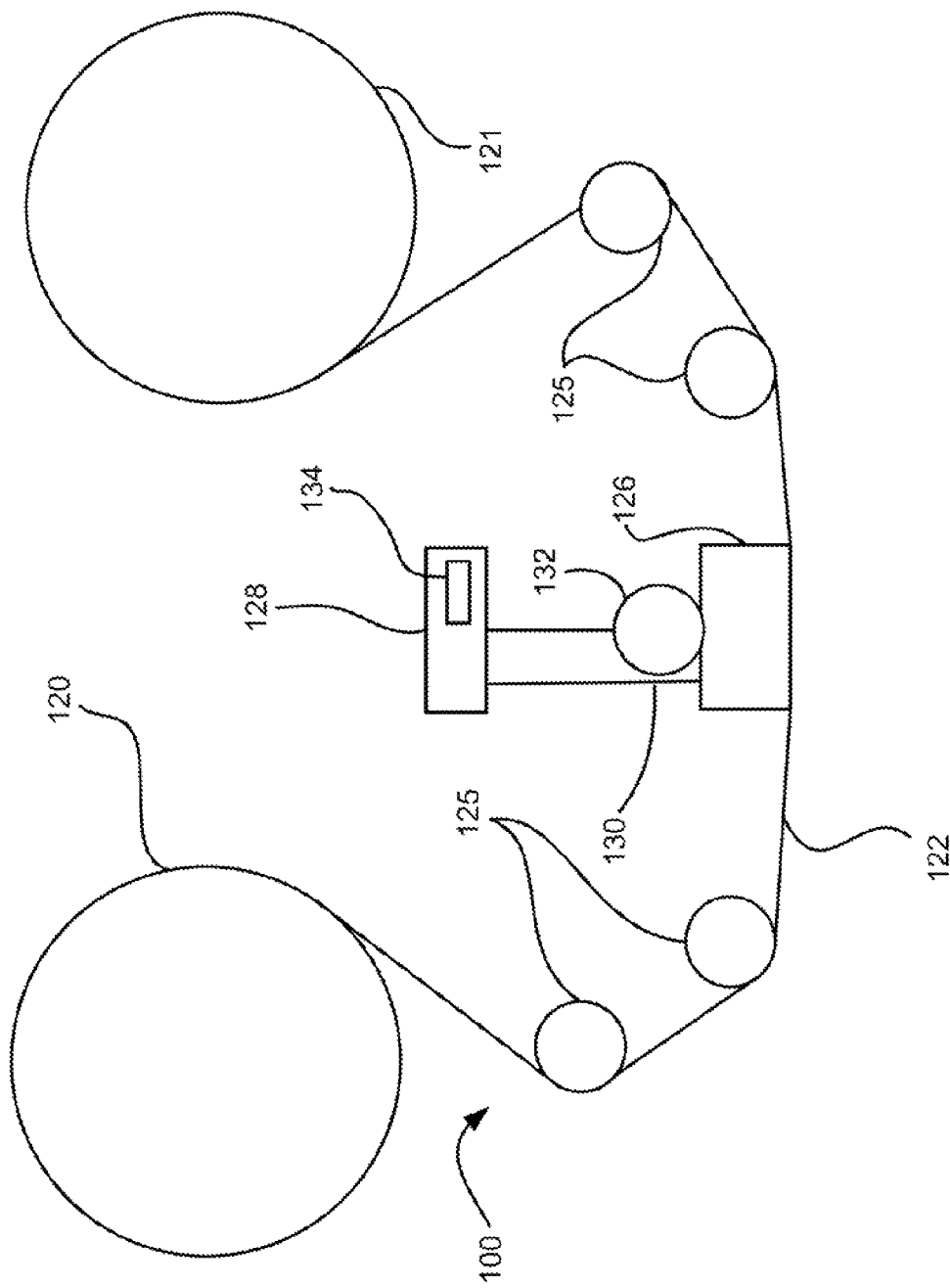
FIG. 1 is a schematic diagram of a simplified tape drive system according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of tape-based storage systems, as well as operation and/or component parts thereof.

In one general embodiment, a system includes a cable having a plurality of cable leads, wherein at least two of the plurality of cable leads are coupled to at least one of a plurality of sets of element pads of an electronic device, wherein each set of element pads includes two element pads, and wherein at least one set of element pads are coupled to an element of the electronic device. The system also includes a multi-diode chip having a pad-side not facing the cable. The multi-diode chip includes a plurality of sets of contact pads on the pad-side of the multi-diode chip, each set of contact pads including a first contact pad and a second contact pad and a plurality of crossed diode sets, wherein each set of crossed diodes is coupled between a first contact pad and a second contact pad of one set of contact pads. At least two of the plurality of cable leads are coupled via wire-bonding to one of the plurality of sets of contact pads of the multi-diode chip for providing electrostatic discharge (ESD) protection for at least one element of the electronic device coupled to the at least two cable leads.

In another general embodiment, a method includes coupling, via wire-bonding, a set of cable leads of a cable to a set of contact pads on a pad-side of a multi-diode chip and coupling, via wire-bonding, the sets of cable leads to elements of an electronic device. The pad-side of the multi-diode chip does not face the cable, the multi-diode chip has a thickness in a direction normal to a plane of the cable of about 100 microns or less, and the set of contact pads are coupled there between by at least one crossed diode.

In another general embodiment, a system includes a cable having a plurality of cable leads and a multi-diode chip having a pad-side not facing the cable. The multi-diode chip includes a plurality of sets of contact pads on the pad-side of the multi-diode chip, each set of contact pads including a first contact pad and a second contact pad, and a plurality of crossed diode sets. Each set of crossed diodes is coupled between a first contact pad and a second contact pad of one set of contact pads, and at least two of the plurality of cable leads are coupled via wire-bonding to one of the plurality of sets of contact pads of the multi-diode chip for providing ESD protection.

According to one embodiment, an un-packaged diode chip is used to provide ESD protection for a magnetic head. The chip is attached to a cable via any suitable mechanism such as an adhesive, pressure-sensitive adhesive (PSA), etc., with the electrical contact pads of the chip not facing the cable. The electrical connection of the chip pads to the cable leads or sensor pads is made using wire bond techniques. A coating material may be used, such as an adhesive, that may then be applied on top of the wire-bonds and/or chip to serve one or more purposes, such as to insulate the exposed leads from shorting via accidental external contact to the leads, and/or to provide strain relief to the leads, and/or to improve the bond of the chip system to the cable, etc.

The aspects described above enable attachment of diodes in very small dimensions, even with spacing on the order of a few hundred microns between the cable surface and a near-by electronic device, according to preferred embodiments. Furthermore, because of the nature of the wire bond process, the pad-pitch on the diode chip does not need to be the same as the pad pitch on the cable or the electronic device, enabling multiple choices of locations on the cable, as well as portability to different cable and/or electronic device designs using the same diode chip design. According to another embodiment, the chip may have extra diode elements which might be used in one product and not in another, e.g., to allow for mass production of the chip with applicability to multiple magnetic head and cable designs. In contrast, with the ACF design or a solder design, this would be a problem for two reasons. One is that in order to match the chip pads with the cable leads in the ACF or solder designs, the pitches of the two must be the same. This may not be possible with different cabled products. For example, if cabled product X has device A1 attached to leads 1 and 2 and device A2 to leads 3 and 4, both of which use electronic device EA, while cabled product Y has device A1 attached to leads 1 and 2 and another device B1 to leads 3 and 4 which use electronic devices EA, EB respectively, then the same chip cannot be used for both devices X and Y using ACF or solder bonding without considerable re-routing of the cable leads. Using the wire bond technique, according to some embodiments, electronic devices EA 1, EA2 and EB1 may be added onto the chip with none of the problems associated with the ACF or solder designs. For device X, EA1 and EA2 may be wired up to A1 and A2 of device X and EA1 and EB1 to A1 and B1 of device Y. This portability of a single chip may significantly reduce cost of the chip due to economies of scale.

FIG. 1 illustrates a simplified tape drive 100 of a tape-based data storage system, which may be employed in the context of the present invention. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive and a host (integral or external) to send and receive the data and for controlling the operation of the tape drive and communicating the status of the tape drive to the host, all as will be understood by those of skill in the art.

Figure 2:
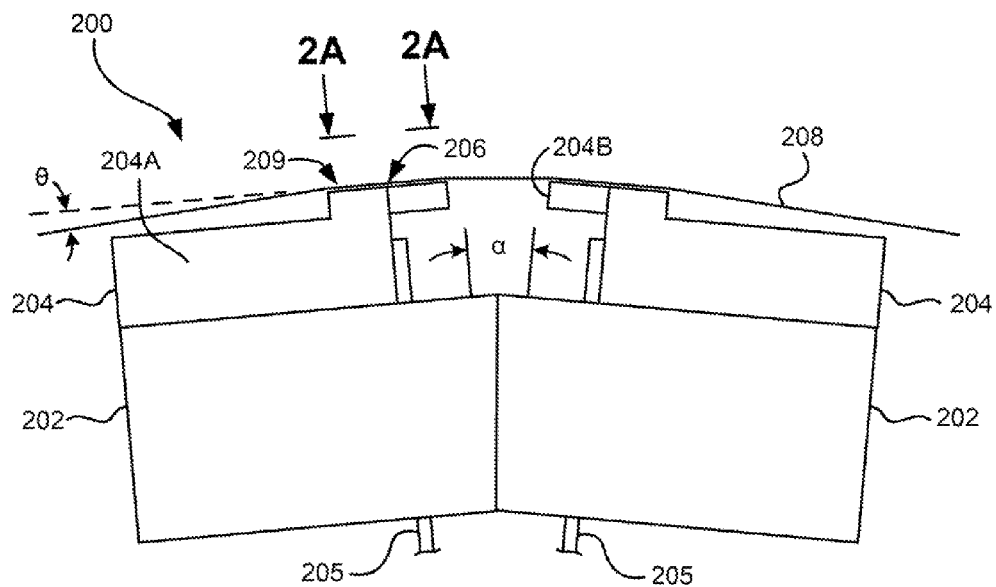
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases are typically "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between ⅛ degree and 4½ degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo readers. Cables 205 couple the readers and/or writers 206 to a controller.

Tape heads with read, write, and servo elements exemplify the concept of an electronic device with multiple elements requiring different diode types. For example, inductive writers do not require diode protection, and attaching diodes across the leads of a writer element will often be deleterious to the writer performance, as the diodes will shunt current away from the writers, decreasing the writer currents for a given applied voltage/current. Often, servo and reader elements operate under different current/voltage (IV) characteristics and thus require different diode designs. Therefore, a single diode chip which is capable of being used with a variety of magnetic head designs and could be wired to the magnetic head in a particular way to avoid negative consequences of attaching diodes across certain elements would be preferable.

Figure 2A:
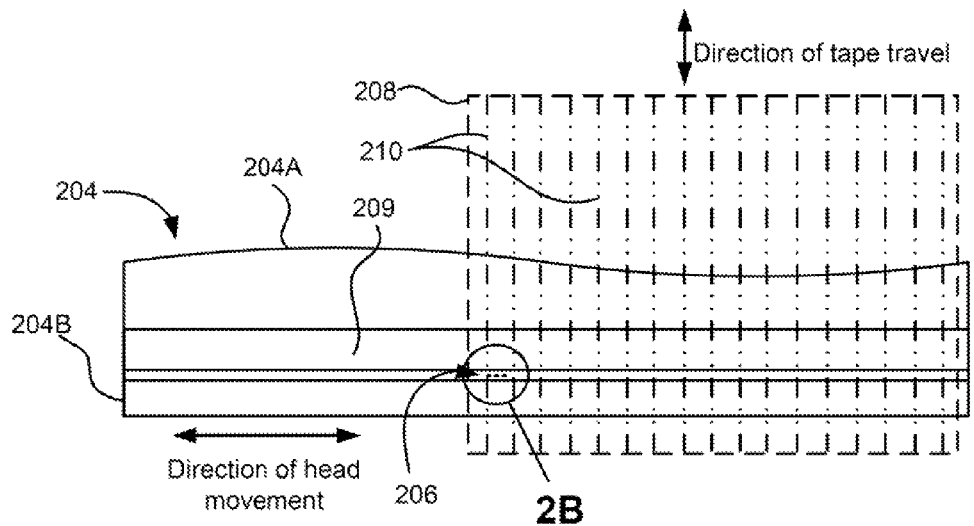
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 4-22 data bands, e.g., with 16 data bands and 17 servo tracks 210, as shown in FIG. 2A on an e.g., one-half inch wide tape 208. Current LTO products include 4 data bands and 5 servo tracks. The data bands are defined between servo tracks 210. Each data band may include a number of data tracks, for example 96 data tracks (not shown). During read/write operations, the readers and/or writers 206 are positioned within one of the data bands. Outer readers, sometimes called servo readers, read the servo tracks 210. The servo signals are in turn used to keep the readers and/or writers 206 aligned with a particular track during the read/write operations.

Figure 2B:
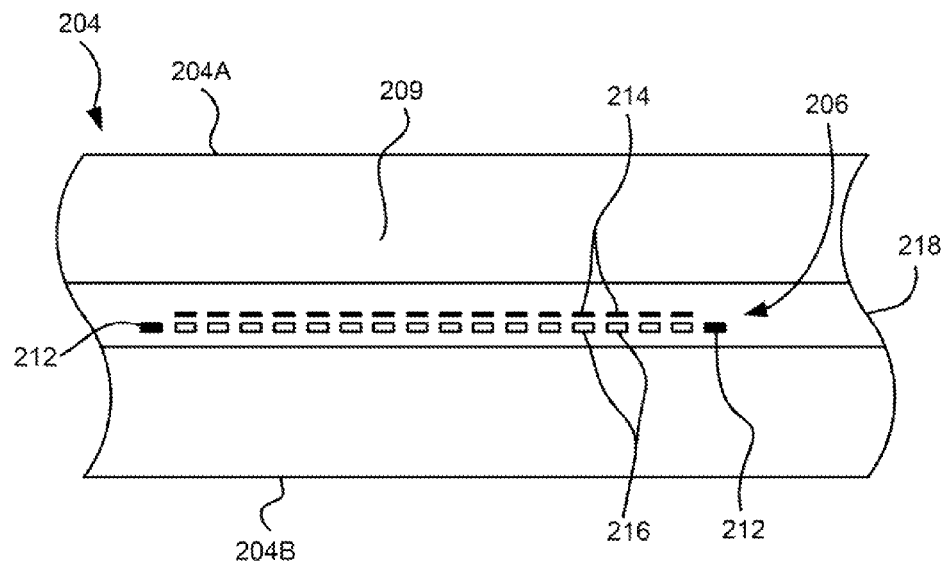
FIG. 2B is a detailed view taken from Circle 2B of FIG. 2A.

FIG. 2B depicts a plurality of readers and/or servos and/or writers 206 formed in a gap 218 on the module 204 in Circle 2B of FIG. 2A. As shown, the array of readers and writers 206 includes, for example, 16 writers 214, 16 readers 216 and two servo readers 212, though the number of elements may vary. Illustrative embodiments include 8, 16, 32, 33, 40, 64, 66, etc. readers and/or writers 206 per array. A preferred embodiment includes 33 readers per array and/or 33 writers per array, 32 of which are used for forward and 32 for reverse tape motion. This allows the tape to travel more slowly, thereby reducing speed-induced tracking and mechanical difficulties. While the readers and writers may be arranged in a piggyback configuration as shown in FIG. 2B, the readers 216 and writers 214 may also be arranged in an interleaved configuration. Alternatively, each array of readers and/or writers 206 may be readers or writers only, and the arrays may contain one or more servo readers 212. As noted by considering FIGS. 2 and 2A-B together, each module 204 may include a complementary set of readers and/or writers 206 for such things as bi-directional reading and writing, read-while-write capability, backward compatibility, etc.

Figure 2C:
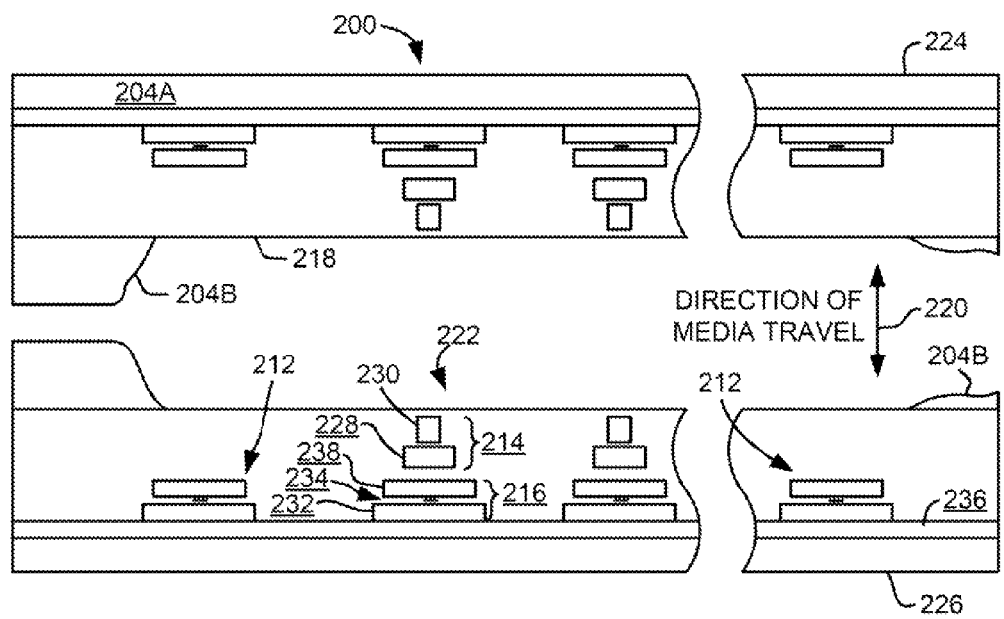
FIG. 2C is a detailed view of a partial tape bearing surface of a pair of modules.

FIG. 2C shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Figure 3:
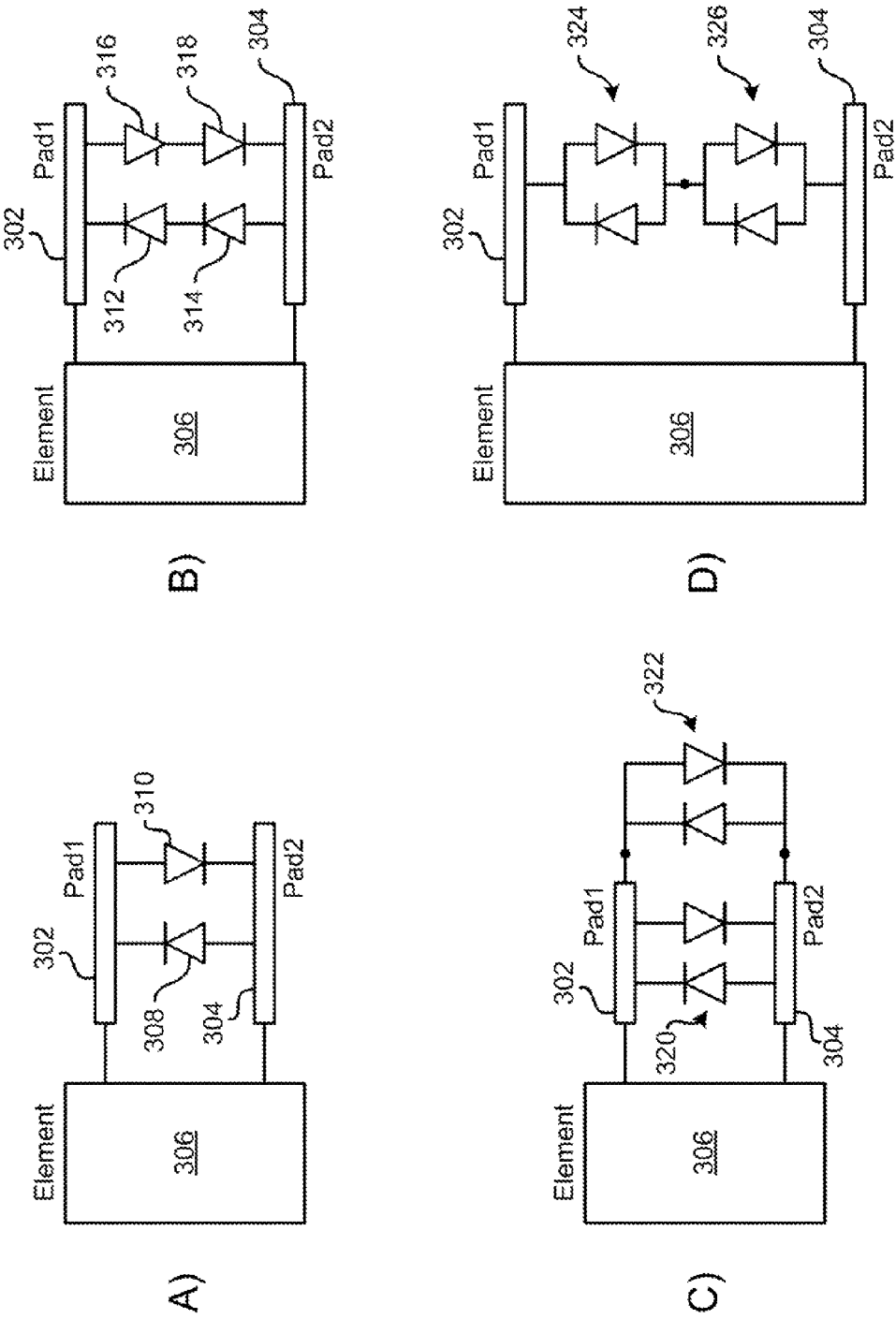
FIG. 3 is a schematic diagram of four diode arrangements, according to various embodiments.

Now referring to FIG. 3, four examples of different types of diode "elements" used in a chip to protect against ESD damage are shown, according to some embodiments. Of course, many more diode arrangements are possible, as known in the art. Pad1 302 connects to one leg of an element 306, and Pad2 304 connects to the other leg of the element 306. Of course, the element may be of any type as known in the art, such as an MR sensor, including giant magnetoresistive (GMR), anisotropic magnetoresistive (AMR), tunnel valve magnetoresistive (TMR) sensors, etc., inductive writers, resistive measurement elements, etc. In configuration A, two diodes 308, 310 (single crossed diodes) are positioned in reverse direction of each other between Pad 1 302 and Pad 2 304, thereby providing protection in either direction. In configuration B, one set of two diodes 312, 314 are positioned in series in one direction, while another set of two diodes 316, 318 are positioned in series in a reverse direction (dual crossed diodes) between Pad1 302 and Pad2 304. Though the dual crossed diode configuration B provides less protection to the element 306 than the single crossed diode configuration A, it also requires higher voltages before shunting current in normal drive operation, which might be necessary to avoid degrading a reader's or servo's functional performance.

Dual crossed diode configurations D is electrically equivalent to the dual crossed diode configuration B, according to some embodiments. In dual crossed diode configuration C, two pairs of single crossed diodes 320, 322, are coupled in parallel, according to one embodiment. The second pair of single crossed diodes 322 are shown having a wire extending to connect them, but may be arranged as the first pair of single crossed diodes 330 between Pad1 302 and Pad2 304, in one approach. In dual crossed diode configuration D, two pairs of single crossed diodes 324, 326 are shown coupled in series between Pad1 302 and Pad2 304, according to one approach. These arrangements also provide ESD protection for the element 306. Of course, many other diode arrangements are possible as would be known to one of skill in the art, and the invention is not limited to these examples only. For example, there may be any number of pairs of crossed diodes coupled between the contact pads 302, 304, such as three, four, six, etc., pairs of crossed diodes coupled in series, in parallel, etc., between the contact pads 302, 304.

Figure 4A:
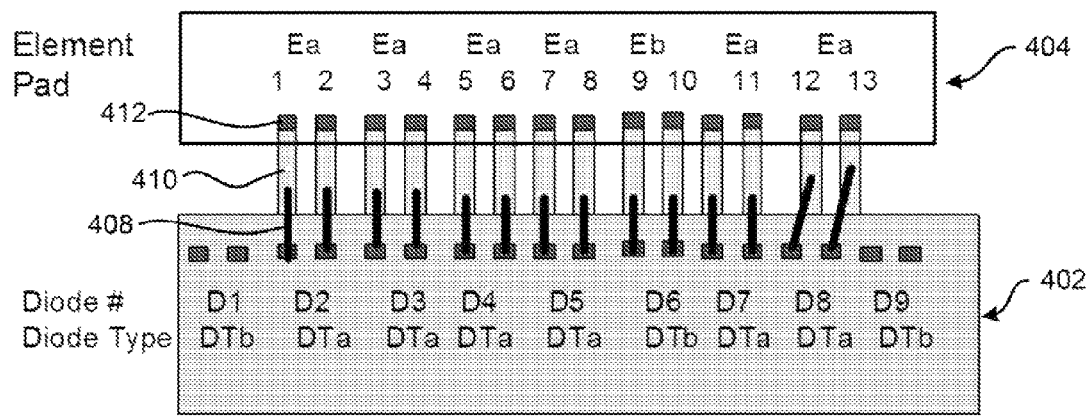
FIG. 4A illustrates a coupling between an electronic device and a multi-diode chip, according to one embodiment.

Now referring to FIG. 4A, a schematic of a connection of a multi-diode chip 402 to a multi MR element sensor 404 is shown, according to one embodiment. Elements Ea and Eb are coupled to diode types DTa and DTb, respectively. There are no other elements shown, but they may exist and simply do not use or require diode protection. The connection is made by wire-bond 408, and may be to cable leads 410 as shown, to the element pads 412, to both, etc.

Figure 4B:
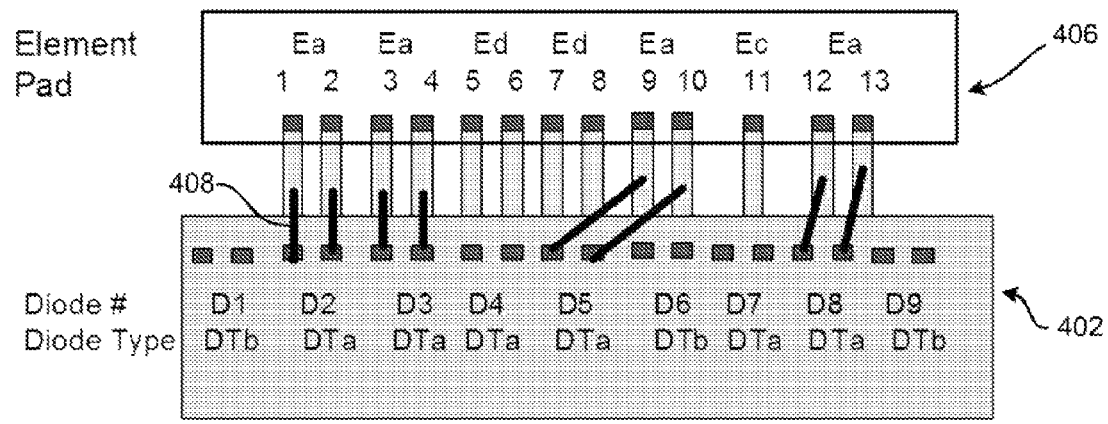
FIG. 4B illustrates a coupling between an electronic device and a multi-diode chip, according to one embodiment.

In FIG. 4B, a schematic of a connection of the multi-diode chip 402 to a multi MR element sensor 406 is shown, according to one embodiment, having a different element layout than multi MR element sensor 404 as shown in FIG. 4A. As can be seen from this schematic, the same multi-diode chip 402 may be used, even with different element layouts, as long as there are a sufficient number of diode connections and diode types available. Of course, this may be assured by properly designing and selecting the multi-diode chip 402 which is used for the element layout. Elements Ea and Eb are coupled to diode types DTa and DTb, respectively. Element Ec is a single pad connection, and Element Ed is a dual connection electronic device, neither of which uses diode protection. Therefore, Ec and Ed are not coupled to any diodes on the multi-diode chip 402. The ability to connect the element to a diode which is not placed directly across from it is an enabling aspect of the invention, according to one embodiment.

Figure 5:
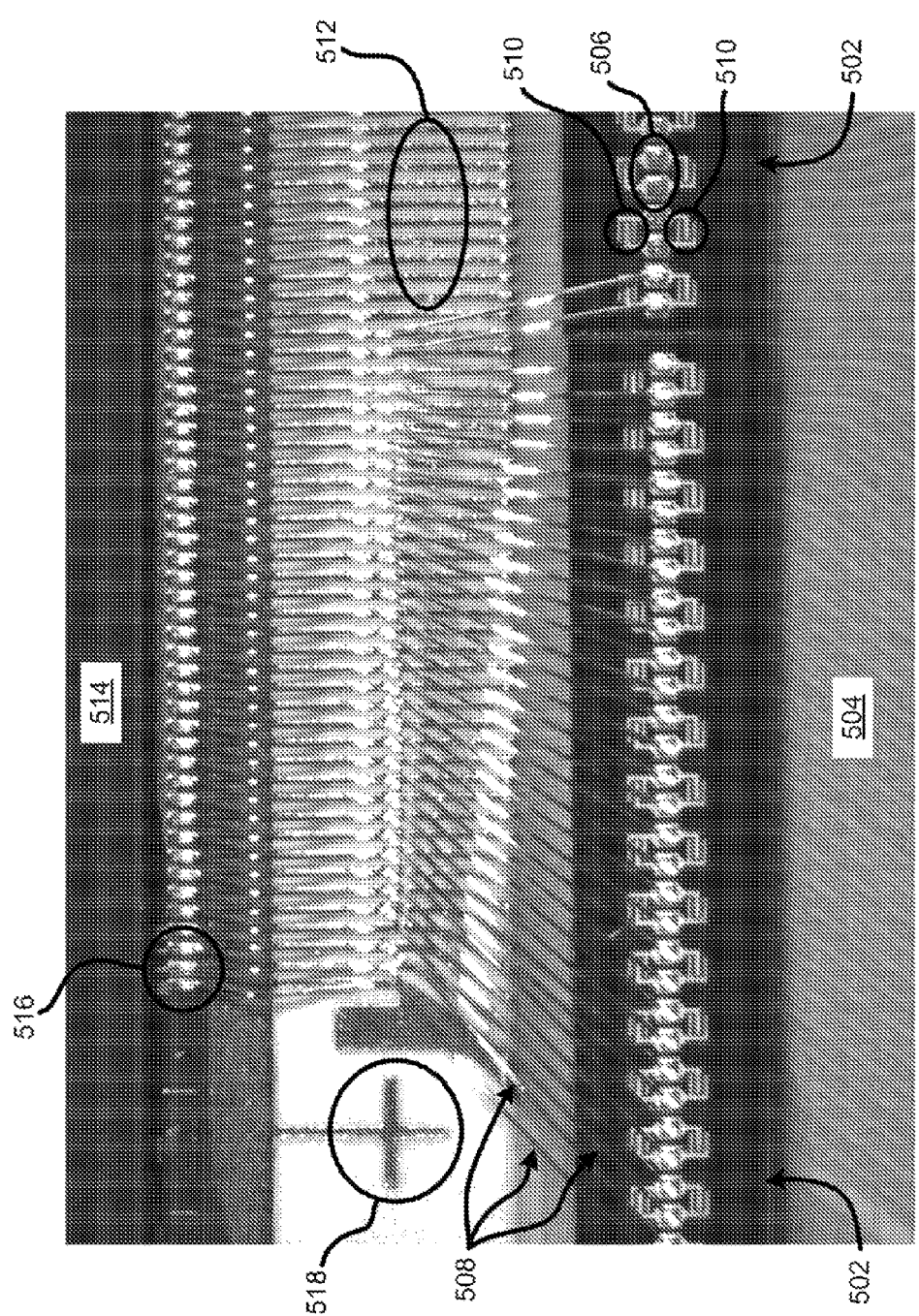
FIG. 5 illustrates a coupling between an electronic device and a multi-diode chip, according to one embodiment.

Now referring to FIG. 5, a schematic diagram of multi-diode chips 502 bonded to a flexible cable 504 in a CMOD assembly including multiple GMR sensors is shown, according to one embodiment. On a flexible cable 504, the diode chip(s) 502 may be attached to exposed cable leads 512 of the cable 504, among other attachment methods. Two multi-diode chips 502 are shown, but in alternative embodiments, more or less multi-diode chips 502 may be used, such as 1, 3, 4, etc. This may or may not depend on the number of connections on the sensor, according to some approaches. Note that many of the diodes 510 are not wired up in FIG. 5, as in this embodiment, the multi-diode chips 502 include more diodes 510 than the electronic device 514 has elements which require or would benefit from ESD protection. This also demonstrates how the same diode chips 502 may be used in a variety of different systems.

According to one embodiment, the diode chips 502 may be fabricated on a silicon wafer. The wafer can be lapped down to a thicknesses of about 50 microns to about 300 microns or more. The diode chip 502 may then be diced into small sizes on the order of about 1 mm by about 1 mm, or larger or smaller, depending on the number of diodes, the number of elements of the electronic device (such as a magnetic head, sensor, etc.), and contact pad 506 spacing for the specific application being addressed and the element(s) (such as sensor(s)) being protected. The center-to-center spacing between contact pads 506 on the diode chip 502 (pitch) can be on the order of about 90 microns in some embodiments, and possibly smaller, and easily larger to about 100 microns, about 150 microns, about 200 microns or more. The pads 506 on the diode chip 502 may be constructed of aluminum, may be coated with gold for better corrosion resistance, may be silver, platinum, etc., or any other material as known in the art.

In one embodiment, the diode chip(s) 502 may be mounted to the cable 504, e.g., using a fixture using a vacuum to grab the parts or any other known process. The fixture may be precision aligned to mount the diode chip 502. The diode chip 502 may be bonded to the cable 504 using any method known in the art, such as using a thin PSA, applying an adhesive using a syringe applicator, etc. Any type of adhesive as known in the art may be used, such as an epoxy, a cyanoacrylate, an ultraviolet (UV) curable adhesive, a thermally curable adhesive, etc. Any of these adhesives may include or be filled with conductive filler materials, such as carbon, graphite, carbon nanotubes, silver particles, etc., to form an adhesive composite. The filler materials may adjust a resistance of the composite adhesive. The resistance of the composite adhesive may range from about $10^5 \Omega$ to about $10^9 \Omega$, in some embodiments, which is ideal for ESD prevention using conductive adhesives.

Fiduciary marker(s) 518 on a front surface of the diode chip 502, on the electronic device 514, on the cable 504, etc., may be used to align a wire-bond instrument to properly couple the pads 506 on the diode chip 502 to the cable leads 512 of the cable 504.

According to one embodiment, wires 508 may attach the diodes 510 via the pads 506 to the cable leads 512. In another operation, more or the same wires 508 may attach the cable 504 via the cable leads 512 to the element pads 516. An optional adhesive or other overcoat material may be applied across the wires 508 and/or the exposed diode chip 502 and/or the element pads 516 to insulate one or more of the wires 508, the pads 506 on the diode chip 502, and the element pads 516 from accidental shorting, to act as a strain relief, to help bond the diode chip 502 to the cabled module assembly (cable 504), to provide corrosion resistance, etc.

In another embodiment, wires 508 may attach the diodes 510 via the pads 506 to the cable 504. In this embodiment, the cable leads 512 may then be attached, via more or the same wires 508, to the element pads 516.

With continued reference to FIG. 5, a system is described according to one embodiment. The system includes a cable 504 having a plurality of cable leads 512. At least two of the plurality of cable leads 512 are coupled to at least one of a plurality of sets of element pads 516 of an electronic device 514, each set of element pads 516 includes two element pads, and at least one set of element pads 516 are coupled to an element of the electronic device 514, such as a MR sensor, some other vulnerable element in a magnetic head, or any other element as would be known to one of skill in the art which may benefit from ESD protection. The multi-diode chip 502 has a pad-side not facing the cable 514 (the side visible in the embodiment in FIG. 5). The pad-side may face any direction except directly facing the cable 504 (not shown in FIG. 5). The multi-diode chip includes a plurality of sets of contact pads 506 on the pad-side of the multi-diode chip 502, each set of contact pads 506 including a first contact pad and a second contact pad. The multi-diode chip 502 also includes a plurality of crossed diodes 510, each crossed diode 510 being coupled between a first contact pad and a second contact pad of one set of contact pads. Crossed diodes are important for ESD protection since ESD in the manufacturing line can be of either positive or negative polarity with respect to the element contact pads, and crossed diodes provide protection against each type of ESD. At least two of the plurality of cable leads 512 are coupled via wire-bonding 508 to one of the plurality of sets of contact pads 506 for providing ESD protection for at least one element of the electronic device 514 coupled to the at least two cable leads 512.

When the description mentions coupling the plurality of cable leads 512 via wire-bonding 508 to one of the plurality of sets of contact pads 506 for providing ESD protection, what is meant is that the contact pads 506, which have at least one crossed diode pair there between, are connected at some point across a circuit which includes the element for which protection is desired, the cable leads 512 coupled to the element pads 516, and the affected portion of the cable 504. For example, the multi-diode chip 502 may be coupled to the cable 514 at a location near the element pads 516 as shown, away from the element pads 516 (e.g., toward the middle or other end of the cable 504), to the cable leads 512 between the cable 504 and the element pads 516, to the elements pads 516, etc.

Now that one embodiment of the system has been described, particular embodiments may be described in relation to this previously described embodiment. In one such embodiment, at least some of the plurality of crossed diodes 510 may include crossed sets of diodes 510 in series. This provides additional ESD protection for any elements coupled to this arrangement.

In another embodiment, the system may include an adhesive (not shown, positioned beneath the multi-diode chip 502 in FIG. 5) adhering the multi-diode chip 502 to a surface of the cable 504. In one such embodiment, the adhesive may be a PSA, an epoxy, a cyanoacrylate, an ultraviolet (UV) curable adhesive, a thermally curable adhesive, etc., or any other adhesive known in the art. Any of these adhesives may include or be filled with conductive filler materials, such as carbon, graphite, carbon nanotubes, silver particles, etc., to form an adhesive composite. The filler materials may adjust a resistance of the composite adhesive. The resistance of the composite adhesive may range from about $10^5 \Omega$ to about $10^9 \Omega$, in some embodiments, which is ideal for ESD prevention using conductive adhesives.

According to another embodiment, the electronic device 514, cable 504, and/or multi-diode chip 502 may include one or more fiduciary markers 518 for aligning a wire-bonding instrument with the electronic device 514, cable 504, and/or multi-diode chip 502. Any type of fiduciary marker may be used as known in the art. Some exemplary fiduciary markers include visual indicators such as lines, crosses, circles, dots, etc., physical indicators such as protruding members, grooves, slots, etc., pin-hole alignment guides, etc.

In one approach, the system may include a casing surrounding the multi-diode chip 502, the cable leads 512, and the wire-bonds 508 for protecting the multi-diode chip 502, the cable leads 512, and the wire-bonds 508 from electrical shorting, among other dangers. In one embodiment, the casing may be formed of an adhesive or encapsulant of a type known in the art, either the same or different from that used to adhere the multi-diode chip 502 to the cable 504.

In some embodiments, the multi-diode chip 502 may have a thickness in a direction normal to a plane of the cable 504 (e.g., straight up from the page) of about 300 microns or less, about 200 microns or less, about 100 microns or less, about 50 microns or less, etc.

As shown in FIG. 5, in some embodiments, more than one multi-diode chip 502 may be coupled to the plurality of cable leads 512. As shown in FIG. 5, there are two multi-diode chips 502, but only a single chip or more than two chips may be used, such as three, four, five, six, etc. According to one embodiment, the plurality of multi-diode chips 502 may include more sets of contact pads 506 than sets of element pads 516 of the electronic device 514 that are coupled to the multi-diode chip 502. This allows for the multi-diode chip 502 to be used with more than one type of electronic device, with multiple electronic devices, etc.

For example, the multi-diode chip 502 may be referred to as a universal diode chip which may include multiple pairs of contact pads with various types of diodes there between. This universal diode chip may then be used with any number of different types of electronic devices, and multiple universal diode chips may be used for a single electronic device, to satisfy the protection requirements of the device. In another approach, the multi-diode chip may have different diode arrangements, such as diodes with different current-voltage (I-V) characteristics, multiple diodes in series (such as dual crossed diodes mixed with single crossed diodes), etc.

According to one approach, some of the crossed diodes 510 may be single crossed diode pairs and some of the crossed diodes 510 may be multiple crossed diode pairs (numbering 2 or more).

According to some approaches, the multi-diode chip 502 may be located near the plurality of sets of element pads 516 of the electronic device 514, as shown in FIG. 5. In alternative approaches, the multi-diode chip 502 may be located on the cable 504 at a location away from the plurality of sets of element pads 516 of the electronic device 514. This flexibility in placement of the multi-diode chip 502 is due to the ability to wire-bond the contacts together, which can be performed over a much greater distance than conventional methods of coupling the pads. Note however that the multi-diode chip 502 may be wire-bonded to cable leads 512 exposed at a location away from the element pads 516.

In some more approaches, a pad pitch of the multi-diode chip 502 may be different than a cable pitch of the cable 504. For example, as shown in FIG. 5, the center-to-center distance (pitch) between the contact pads 506 of the multi-diode chip 502 may be wider than the center-to-center distance between wires in the cable 504. In another example, the pitch of the contact pads 506 of the multi-diode chip 502 may be narrower than the pitch of the wires in the cable 504. Of course, they may be equal as well.

In other approaches, a pad pitch of the multi-diode chip 502 may be different than a pad pitch of the electronic device 514. For example, as shown in FIG. 5, the pitch of the contact pads 506 of the multi-diode chip 502 may be wider than the pitch of the element pads 516 of the electronic device 514. In another example, the pitch of the contact pads 506 of the multi-diode chip 502 may be narrower than the pitch of the element pads 516 of the electronic device 514. Of course, they may be equal as well.

In one embodiment, a method for providing ESD protection for at least one element of an electronic device includes coupling, via wire-bonding, a set of cable leads of a cable to a set of contact pads on a pad-side of a multi-diode chip. The method may also include coupling, via wire-bonding, the sets of cable leads to elements of an electronic device. The pad-side of the multi-diode chip does not face the cable, the multi-diode chip has a thickness in a direction normal to a plane of the cable of about 100 microns or less, and the set of contact pads are coupled there between by at least one crossed diode pair. This method allows for a flexible approach to providing ESD protection, and allows for a universal diode chip to be used with many different electronic devices and elements requiring protection.

Some of the advantages of the wire-bond attachment method for diodes over conventional ACF bonding are that wire-bond is self packaging, may be applied to smaller sizes, may be applicable to multiple magnetic heads and cable products, allows for versatile locations for attachment to the cable and for insulation glue.

It will be clear that the various features of the foregoing methodologies may be combined in any way, creating a plurality of combinations from the descriptions presented above.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
a cable having a plurality of cable leads, wherein at least two of the plurality of cable leads are coupled to at least one of a plurality of sets of element pads of an electronic device, wherein each set of element pads includes two element pads, wherein at least one set of element pads are coupled to an element of the electronic device; and
a multi-diode chip having a pad-side not facing the cable, the multi-diode chip comprising:
a plurality of sets of contact pads on the pad-side of the multi-diode chip, each set of contact pads including a first contact pad and a second contact pad; and
a plurality of crossed diode sets, wherein each set of crossed diodes is coupled between a first contact pad and a second contact pad of one set of contact pads,
wherein at least two of the plurality of cable leads are coupled via wire-bonding to one of the plurality of sets of contact pads of the multi-diode chip for providing electrostatic discharge (ESD) protection for at least one element of the electronic device coupled to the at least two cable leads.

2. The system as recited in claim 1, wherein at least some of the plurality of crossed diodes includes more than one diode in series.

3. The system as recited in claim 1, further comprising an adhesive adhering the multi-diode chip to a surface of the cable.

4. The system as recited in claim 1, further comprising a coating material on top of the diode chip and/or wire bonds that provide the wire-bonding.

5. The system as recited in claim 1, wherein the multi-diode chip further comprises one or more fiduciary markers for aligning a wire-bonding instrument with the multi-diode chip.

6. The system as recited in claim 1, further comprising a casing surrounding the multi-diode chip, the cable leads, and the wire-bonds for protecting the multi-diode chip, the cable leads, and the wire-bonds from electrical shorting.

7. The system as recited in claim 1, wherein the multi-diode chip has a thickness in a direction normal to a plane of the cable of less than about 300 microns.

8. The system as recited in claim 1, wherein the multi-diode chip has a thickness in a direction normal to a plane of the cable of about 100 microns or less.

9. The system as recited in claim 1, wherein a plurality of multi-diode chips are coupled via wire-bonding to the plurality of cable leads.

10. The system as recited in claim 9, wherein the plurality of multi-diode chips include more sets of contact pads than sets of element pads of the electronic device that are coupled to the multi-diode chip.

11. The system as recited in claim 1, wherein the multi-diode chip includes more sets of contact pads than sets of element pads of the electronic device that are coupled to the multi-diode chip.

12. The system as recited in claim 1, wherein the multi-diode chip has different diode arrangements.

13. The system as recited in claim 12, wherein some of the crossed diodes are single crossed diode pairs and some of the crossed diodes are multiple crossed diode pairs.

14. The system as recited in claim 1, wherein the electronic device is a magnetic head.

15. The system as recited in claim 1, wherein the multi-diode chip is located near the plurality of sets of element pads of the electronic device.

16. The system as recited in claim 1, wherein the multi-diode chip is located on the cable at a location away from the plurality of sets of element pads of the electronic device.

17. The system as recited in claim 1, wherein a pad pitch of the multi-diode chip is different than a cable pitch of the cable.

18. The system as recited in claim 1, wherein a pad pitch of the multi-diode chip is different than a pad pitch of the electronic device.

19. A method, comprising:
coupling, via wire-bonding, a set of cable leads of a cable to a set of contact pads on a pad-side of a multi-diode chip; and
coupling, via wire-bonding, the sets of cable leads to elements of an electronic device,
wherein the pad-side of the multi-diode chip does not face the cable,
wherein the multi-diode chip has a thickness in a direction normal to a plane of the cable of about 100 microns or less, and
wherein the set of contact pads are coupled there between by at least one crossed diode.

20. A system, comprising:
a cable having a plurality of cable leads; and
a multi-diode chip having a pad-side not facing the cable, the multi-diode chip comprising:
 a plurality of sets of contact pads on the pad-side of the multi-diode chip, each set of contact pads including a first contact pad and a second contact pad; and
 a plurality of crossed diode sets, wherein each set of crossed diodes is coupled between a first contact pad and a second contact pad of one set of contact pads,
wherein at least two of the plurality of cable leads are coupled via wire-bonding to one of the plurality of sets of contact pads of the multi-diode chip for providing electrostatic discharge (ESD) protection.

* * * * *